(12) United States Patent
Jeon et al.

(10) Patent No.: US 10,884,063 B2
(45) Date of Patent: Jan. 5, 2021

(54) BATTERY MANAGEMENT SYSTEM

(71) Applicant: Samsung SDI Co., Ltd., Yongin-si (KR)

(72) Inventors: Yoonsuk Jeon, Yongin-si (KR); Gooyun Jung, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 40 days.

(21) Appl. No.: 16/344,784

(22) PCT Filed: Sep. 15, 2017

(86) PCT No.: PCT/KR2017/010130
§ 371 (c)(1),
(2) Date: Apr. 24, 2019

(87) PCT Pub. No.: WO2018/084425
PCT Pub. Date: May 11, 2018

(65) Prior Publication Data
US 2019/0331739 A1 Oct. 31, 2019

(30) Foreign Application Priority Data

Nov. 2, 2016 (KR) ........................ 10-2016-0145182

(51) Int. Cl.
*G01R 31/3835* (2019.01)
*G01R 31/388* (2019.01)
(Continued)

(52) U.S. Cl.
CPC ....... *G01R 31/3835* (2019.01); *G01R 31/388* (2019.01); *H01M 2/206* (2013.01);
(Continued)

(58) Field of Classification Search
CPC ...... G01R 31/00; G01R 31/36; G01R 31/364; G01R 31/382; G01R 31/3835;
(Continued)

(56) References Cited

U.S. PATENT DOCUMENTS

| 5,557,192 A * | 9/1996 | Tamai | H02J 7/008 |
| | | | 320/164 |
| 9,923,358 B2 * | 3/2018 | Tao | H02H 1/0007 |

(Continued)

FOREIGN PATENT DOCUMENTS

| JP | 2003-121516 A | 4/2003 |
| JP | WO2012/133592 A1 | 10/2012 |

(Continued)

OTHER PUBLICATIONS

Korean Office Action dated Nov. 12, 2020, issued in corresponding Korean Patent Application No. 10-2016-0145182 (5 pages).

*Primary Examiner* — Hoai-An D. Nguyen
(74) *Attorney, Agent, or Firm* — Lewis Roca Rothgerber Christie LLP

(57) ABSTRACT

The present invention relates to a battery management system, which includes: at least one cell group configured to include first and second battery cells connected in parallel between first and second bus bars; a plurality of first and second measurement terminals positioned on the first and second bus bars; a plurality of third and fourth measurement terminals positioned at positions on the first bus bar, which correspond to one of ends of each of the first and second battery cells, respectively; a cell voltage measuring unit configured to measure a cell voltage of the cell group by using the first and second measurement terminals; a voltage drop measuring unit configured to measure an error voltage corresponding to a resistance value of the first bus bar by using the third and fourth measurement terminals; and a (Continued)

battery management unit configured to calculate a corrected cell voltage by using the cell voltage and the error voltage.

10 Claims, 4 Drawing Sheets

(51) Int. Cl.
*H02J 7/00* (2006.01)
*H01M 10/42* (2006.01)
*H01M 10/48* (2006.01)
*H01M 2/20* (2006.01)

(52) U.S. Cl.
CPC ....... *H01M 10/425* (2013.01); *H01M 10/482* (2013.01); *H02J 7/0063* (2013.01); *H01M 2010/4271* (2013.01); *H02J 2007/0067* (2013.01)

(58) Field of Classification Search
CPC .. G01R 31/387; G01R 31/388; G01R 31/396; H01M 2/00; H01M 2/20; H01M 2/202; H01M 2/206; H01M 2/10; H01M 2/1016; H01M 10/00; H01M 10/42; H01M 10/425; H01M 10/48; H01M 10/482; H01M 2010/4271; H02J 7/00; H02J 7/0063; H02J 2007/0067; Y02E 60/00; Y02E 60/10
USPC ....... 324/425, 426, 433, 500, 512, 522, 600, 324/629, 647, 649, 705, 713, 718, 720; 702/1, 57, 58, 60, 63, 64
See application file for complete search history.

(56) References Cited

U.S. PATENT DOCUMENTS

| | | | |
|---|---|---|---|
| 10,277,052 B2* | 4/2019 | Li | H02J 7/00036 |
| 2010/0271036 A1 | 10/2010 | Kishimoto et al. | |
| 2013/0113432 A1 | 5/2013 | Suzuki et al. | |
| 2014/0017532 A1 | 1/2014 | Nishihara et al. | |
| 2014/0042995 A1* | 2/2014 | Li | G01R 31/3835 |
| | | | 323/234 |
| 2015/0044531 A1 | 2/2015 | Itagaki et al. | |
| 2015/0061595 A1* | 3/2015 | Kim | H02J 7/0026 |
| | | | 320/112 |
| 2015/0070023 A1* | 3/2015 | Kudo | B60L 58/15 |
| | | | 324/426 |
| 2016/0233700 A1 | 8/2016 | Muto | |
| 2018/0212435 A1* | 7/2018 | Li | H02J 7/007 |
| 2019/0277923 A1* | 9/2019 | Inamoto | G01R 31/396 |

FOREIGN PATENT DOCUMENTS

| | | |
|---|---|---|
| JP | 2013-102592 A | 5/2013 |
| JP | 2014-117068 A | 6/2014 |
| JP | 2015-57593 A | 3/2015 |
| JP | 2016-75557 A | 5/2016 |
| JP | 2016-146728 A | 8/2016 |
| JP | 5976634 B2 | 8/2016 |
| KR | 10-2010-0117521 A | 11/2010 |

* cited by examiner

BATTERY MANAGEMENT SYSTEM

CROSS-REFERENCE TO RELATED APPLICATION(S)

This application is a National Phase Patent Application of International Patent Application Number PCT/KR2017/010130, filed on Sep. 15, 2017, which claims priority of Korean Patent Application No. 10-2016-0145182, filed Nov. 2, 2016. The entire contents of both of which are incorporated herein by reference.

TECHNICAL FIELD

The present invention relates to a battery management system.

BACKGROUND ART

In a battery management system, impedance of a bus bar connecting battery cells is very low. However, the impedance of the bus bar causes a voltage drop due to a battery current, so that an error may occur in a measured voltage value of the battery cell due to the impedance.

Such a voltage measurement error for each battery cell is not large, but voltage measurement errors are accumulated in a battery pack management system that manages several tens to hundreds of battery cells, which deteriorates the measurement accuracy. Therefore, an error occurs between a calculated SOC value and an actual SOC value for a balancing operation between battery cells or a charging/discharging operation of the battery cells, thereby reducing the capacity and cycle-life of a battery pack.

The above information disclosed in this Background section is only for enhancement of understanding of the background of the invention and therefore it may contain information that does not form the prior art that is already known in this country to a person of ordinary skill in the art.

DISCLOSURE

Technical Problem

An exemplary embodiment of the present invention has been made in an effort to provide a battery management system capable of compensating a voltage measurement error of a battery cell.

Technical Solution

An exemplary embodiment of the present invention provides a battery management system including: at least one cell group configured to include first and second battery cells connected in parallel between first and second bus bars; a plurality of first and second measurement terminals positioned on the first and second bus bars; a plurality of third and fourth measurement terminals positioned at positions on the first bus bar, which correspond to one of ends of each of the first and second battery cells, respectively; a cell voltage measuring unit configured to measure a cell voltage of the cell group by using the first and second measurement terminals; a voltage drop measuring unit configured to measure an error voltage corresponding to a resistance value of the first bus bar by using the third and fourth measurement terminals; and a battery management unit configured to calculate a corrected cell voltage by using the cell voltage and the error voltage.

Herein, the battery management unit may output the corrected cell voltage by subtracting the error voltage from the cell voltage of the cell group. The first and second measurement terminals may be physically connected to intermediate positions of the first and second bus bars, respectively. The third and fourth measurement terminals may be physically connected to positive terminals of the first and second, respectively.

In addition, the cell voltage measurement unit may measure a voltage difference between the first and second measurement terminals as the cell voltage. The voltage drop measurement unit may measure a voltage difference between the third and fourth measurement terminals as the error voltage. In addition, the cell group may include: a first cell group configured to include the first and second battery cells connected in parallel between the first and second bus bars; and a second cell group configured to include third and fourth battery cells connected in parallel between the second bus bar and the third bus bar, and the first and second cell groups may be connected in series through the second bus bar.

The first and second cell groups may be connected in series between a first power terminal and a second power terminal, the first bus bar is electrically connected to the first power terminal, and the third bus bar may be electrically connected to the second power terminal. In addition, the first and third bus bars may have a different resistance value from the second bus bar. The battery management unit may calculate a corrected error voltage by correcting the error voltage corresponding to the first and third bus bars depending on a difference between the resistance value of the first and third bus bars and the resistance value of the second bus bar.

Advantageous Effects

According to the exemplary embodiment of the prevention, it is possible to improve the measurement accuracy of the actual cell voltage of each of the battery cells by measuring resistance values of the bus bars connecting the battery cells and by correcting the cell voltage of each of the battery cells using the measured resistance values. Therefore, according to the exemplary embodiment of the present invention, it is possible to accurately monitor and control the condition of the battery pack, thereby increasing the efficiency of the battery pack and improving the cycle-life.

MODE FOR INVENTION

Figure 1:
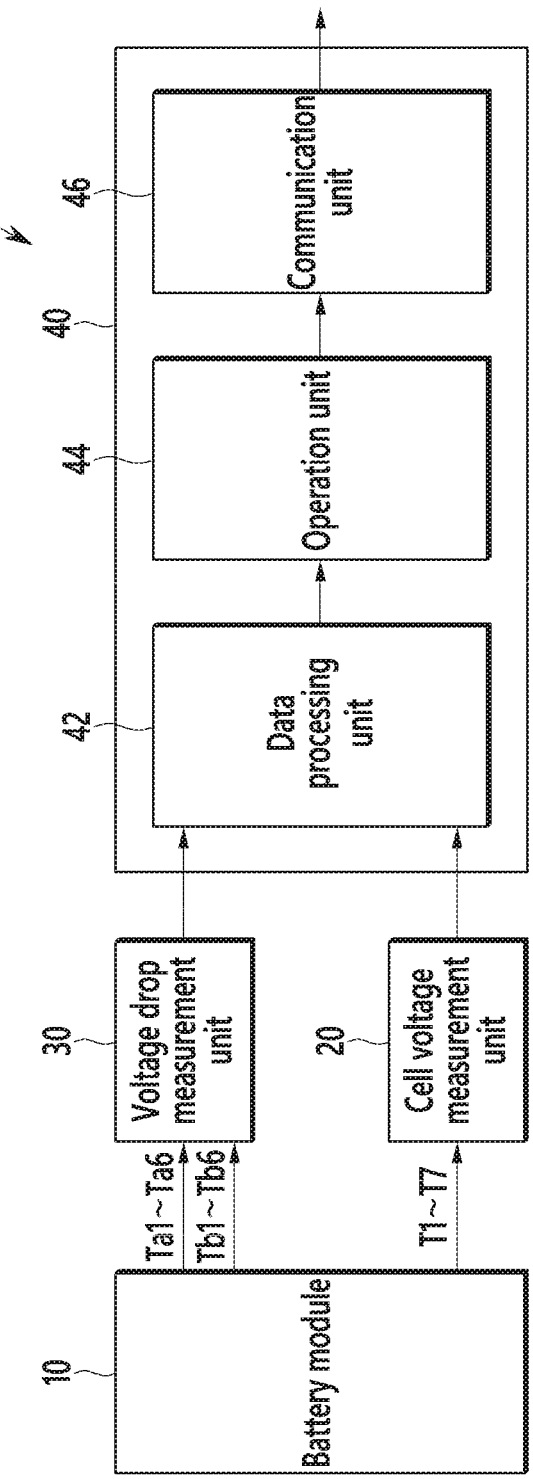
FIG. 1 illustrates a battery pack system according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Throughout this specification and the claims that follow, when it is described that an element is "coupled/connected" to another element, the element may be "directly coupled/connected" to the other element or "indirectly coupled/connected" to the other element through a third element. In addition, unless explicitly described to the contrary, the word "comprise" and variations such as "comprises" or "comprising" will be understood to imply the inclusion of stated elements but not the exclusion of any other elements.

Hereinafter, an exemplary embodiment of the present invention will be described in detail with reference to the accompanying drawings.

Figure 2:
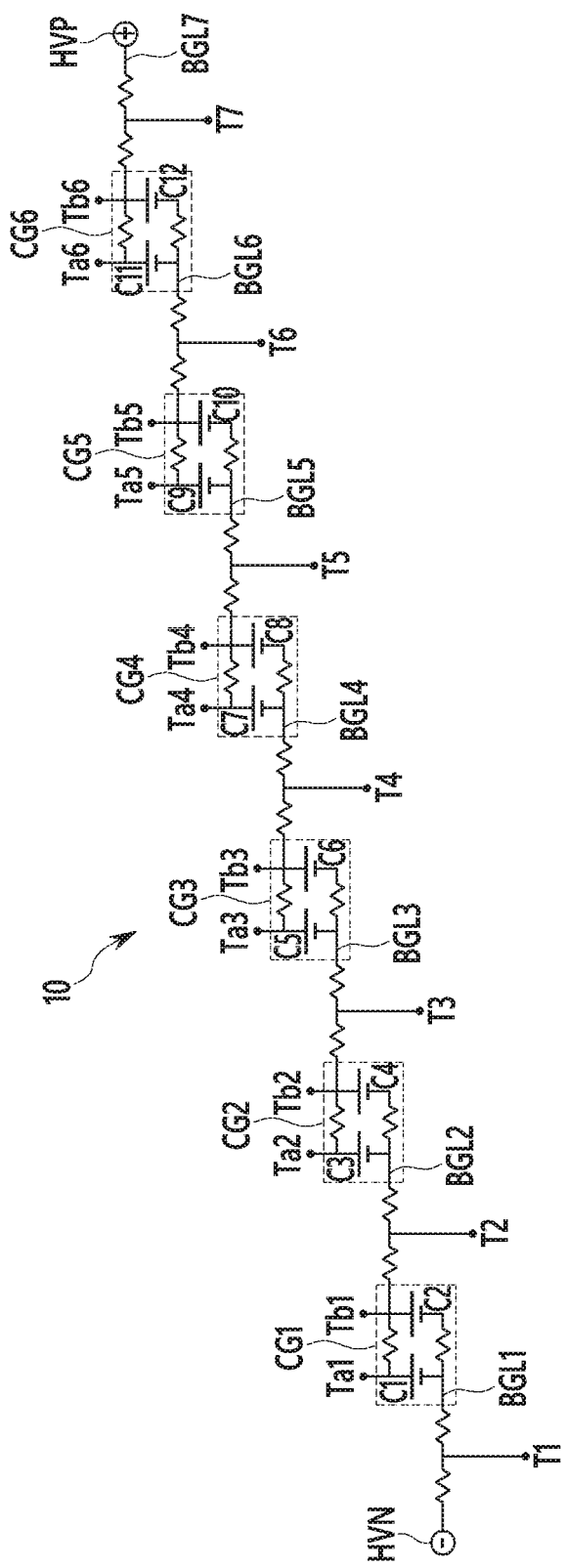
FIG. 2 illustrates an equivalent circuit diagram of a battery module 10 illustrated in FIG. 1.
Figure 3:
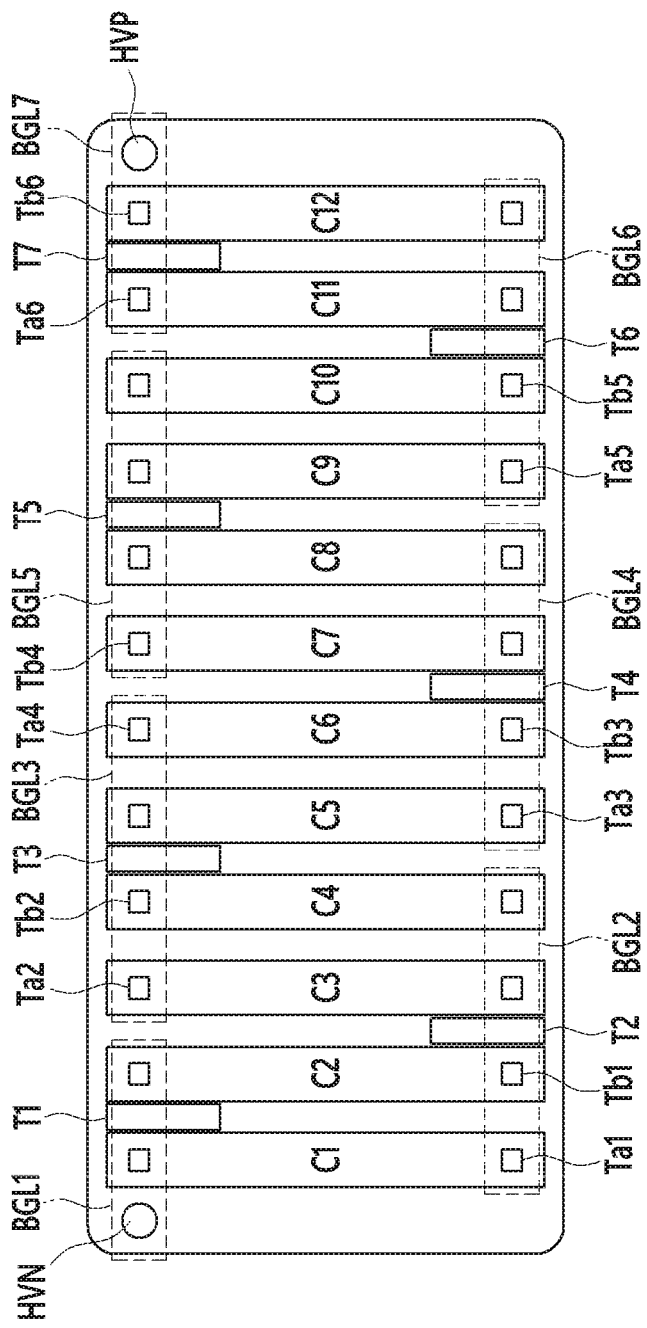
FIG. 3 illustrates a schematic diagram of the battery module 10 illustrated in FIG. 1.
Figure 4:
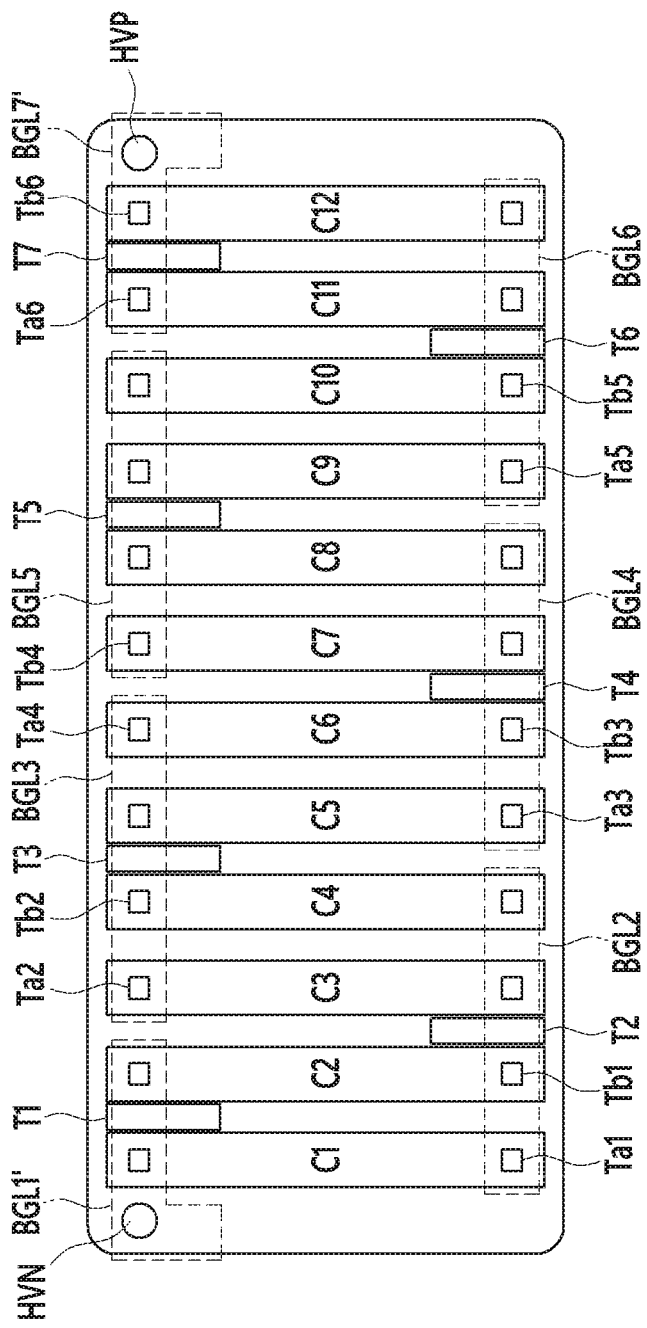
FIG. 4 illustrates a schematic diagram of the battery module 10 illustrated in FIG. 1 according to another exemplary embodiment of the present invention.

FIG. 1 illustrates a battery pack system according to an exemplary embodiment of the present invention, FIG. 2 illustrates an equivalent circuit diagram of a battery module 10 illustrated in FIG. 1, FIG. 3 illustrates a schematic diagram of the battery module 10 illustrated in FIG. 1, and FIG. 4 illustrates a schematic diagram of the battery module 10 illustrated in FIG. 1 according to another exemplary embodiment of the present invention.

Referring to FIG. 1, according to the exemplary embodiment of the present invention, a battery management system 1 includes a battery module 10, a cell voltage measurement unit 20, a voltage drop measurement unit 30, and a battery management unit 40. The battery module 10 illustrated in FIG. 1, which is a unit battery module for constituting a battery pack, has, e.g., a 6S2P structure including six battery cell group connected in series, each of which includes two battery cells connected in parallel.

Specifically, as illustrated in FIG. 2, the battery module 10 includes a plurality of battery cell groups CG1 to CG6, a plurality of first measurement terminals T1 to T7, a plurality of second measurement terminals Ta1 to Ta6, and a plurality of third measurement terminals Tb1 to Tb6. The battery cell groups CG1 to CG6 are connected in series between positive and negative power terminals HVP and HVN. Herein, the positive power terminal HVP is a terminal for receiving positive power (+), and the negative power terminal HVN is a terminal for receiving negative power (−).

Although six battery cell groups CG1 to CG6 are illustrated in the exemplary embodiment of the present invention, the exemplary embodiment of the present invention is not limited thereto, and the number of battery cell groups may be changed. The first battery cell group CG1 includes first and second battery cells C1 and C2 connected in parallel between a first bus bar BGL1 and a second bus bar BGL2. Herein, the first bus bar BGL1 is electrically connected to the negative electrode power terminal HVN.

The second battery cell group CG2 includes third and fourth battery cells C3 and C4 connected in parallel between the second bus bar BGL2 and a third bus bar BGL3. The third battery cell group CG3 includes fifth and sixth battery cells C5 and C6 connected in parallel between the third bus bar BGL3 and a fourth bus bar BGL4.

The fourth battery cell group CG4 includes seventh and eighth battery cells C7 and C8 connected in parallel between the fourth bus bar BGL4 and a fifth bus bar BGL5. The fifth battery cell group CG5 includes ninth and tenth battery cells C9 and C10 connected in parallel between the fifth bus bar BGL5 and a sixth bus bar BGL6.

The sixth battery cell group CG6 includes eleventh and twelfth battery cells C11 and C12 connected in parallel between the sixth bus bar BGL6 and a seventh bus bar BGL7. Herein, the seventh bus bar BGL7 is electrically connected to the positive power terminal HVP.

That is, as illustrated in FIG. 3, the first bus bar BGL1 electrically connects the negative terminals of the first and second battery cells C1 and C2, and the second bus bar BCL2 electrically connects the positive terminals of the first and second battery cells C1 and C2 with the negative terminals of the third and fourth battery cells C3 and C4. The third bus bar BGL3 electrically connects the positive terminals of the third and fourth battery cells C3 and C4 with the negative terminals of the fifth and sixth battery cells C5 and C6.

The fourth bus bar BGL4 electrically connects the positive terminals of the fifth and sixth battery cells C5 and C6 with the negative terminals of the seventh and eighth battery cells C7 and C8. The fifth bus bar BGL5 electrically connects the positive terminals of the seventh and eighth battery cells C7 and C8 with the negative terminals of the ninth and tenth battery cells C9 and C10.

The sixth bus bar BGL6 electrically connects the positive terminal of the ninth and tenth battery cells C9 and C10 with the negative terminal of the eleventh and twelfth battery cells C11 and C12. The seventh bus bar BGL7 electrically connects the positive terminals of the eleventh and twelfth battery cells C11 and C12. Herein, the first to seventh bus bars BGL1 to BGL7 have wire resistance, and a voltage drop occurs when a current flows through the first to seventh bus bars BGL1 to BGL7. This voltage drop may cause an error in the cell voltage of each of battery cell groups CG1 to CG6. Therefore, in the exemplary embodiment of the present invention, an error voltage corresponding to the voltage drop of each of the battery cell groups CG1 to CG6 is measured by using the second measurement terminals Ta1 to Ta6 and the third measurement terminals Tb1 to Tb6.

The first measurement terminals T1 to T7 are respectively positioned on the first to seventh bus bars BGL1 to BGL7. Herein, each of the first measurement terminals T1 to T7 may be a terminal that is physically connected to an intermediate position of each of the first to seventh bus bars BGL1 to BGL7.

In general, since the first and seventh bus bars BGL1 and BGL7 are respectively connected to the negative and positive electrode terminals HVN and HVP, shapes of the first and seventh bus bars BGL1 and BGL7 are different from those of the remaining bus bars. For example, as illustrated in FIG. 4, first and seventh bus bars BGL1' and BGL7' may have wider areas connected to the negative and positive electrode power terminals HVN and HVP. Therefore, resistance values of the first and seventh bus bars BGL1' and BGL7' may be greater than those of the remaining bus bars BGL2 to BGL6. That is, an error voltage corresponding to the voltage drop of each of the first and sixth cell groups CG1 and CG6 may be greater than error voltages corresponding to the voltage drop of each of the remaining cell groups.

The second measurement terminals Ta1 to Ta6 are electrically connected to positive terminals of the first battery cells C1, C3, C5, C7, C9, and C11 of the cell groups CG1 to CG6, respectively. The third measurement terminals Tb1 to Tb6 are electrically connected to positive terminals of the second battery cells C2, C4, C6, C8, C10, and C12 of the cell groups CG1 to CG6, respectively.

That is, as illustrated in FIG. 3, the second measurement terminals Ta1 to Ta6 are physically connected to positions on the bus bars BGL2 to BGL7, which correspond to the positive terminals of the first battery cells C1, C3, C5, C7, C9, and C11, respectively. The second measurement terminals Tb1 to Tb6 are physically connected to positions on the bus bars BCL2 to BGL7, which correspond to the respective positive terminals of the second battery cells C2, C4, C6, C8, C10, and C12.

Herein, since the voltage drop of the cell groups CG1 to CG6 is caused by a current flowing from the positive power terminal HVP to the first negative power terminal HVN, the voltage drop due to the resistance of the first bus bar BGL1 is not measured in the exemplary embodiment of the present invention.

The cell voltage measurement unit 20 measures cell voltages VC1 to VC6 of the cell groups CG1 to CG6 by using the first measurement terminals T1 to T7. Specifically, the cell voltage measurement unit 20 measures a voltage difference between the first measurement terminal T1 and the second measurement terminal T2 as a cell voltage VC1 of the first cell group CG1, and measures a voltage difference between the second measurement terminal T2 and the third measurement terminal T3 as a cell voltage VC2 of the second cell group CG2.

Referring again to FIG. 1 and FIG. 2, the voltage drop measurement unit 30 measures error voltages VE1 to VE6 corresponding to voltage drops caused by the resistance of the respective first to seventh bus bars BGL1 to BGL7 by using the second and third measurement terminals Ta1 to Ta6 and Tb1 to Tb6. Specifically, the voltage drop measurement unit 30 measures a voltage difference between the second measurement terminal Ta1 and the third measurement terminal Tb1 as an error voltage VE1 of the first cell group CG1, and a voltage difference between the second measurement terminal Ta2 and the third measurement terminal Tb2 as an error voltage VE2 of the second cell group CG2.

The battery management unit 40 calculates a corrected cell voltage corresponding to an actual voltage of each of the cell groups CG1 to CG6 by using the cell voltages VC1 to VC6 and the error voltages VE1 to VE6. The battery management unit 40 includes a data processing unit 42, an operation unit 44, and a communication unit 46. The data processing unit 42 performs conversion on the cell voltages VC1 to VC6 for each of the cell groups CG1 to CG6 measured through the cell voltage measurement unit 20 and stores them in a cell voltage table, and performs conversion on the error voltages VE1 to VE6 for each of the cell groups CG1 to CG6 measured through the voltage drop measurement unit 30 and stores them in an error voltage table.

The operation unit 44 calculates a resistance value of each of the bus bars BGL1 to BGL7 by using the error voltage table, and operates a corrected cell voltage of each of the cell groups CG1 to CG6 depending on the resistance value of each of the bus bars BGL1 to BGL7. The operation unit 44 may generate a corrected cell voltage table by reflecting the corrected voltage to the cell voltage table. For example, the operation unit 44 may calculate the corrected cell voltages by subtracting the error voltages VE1 to VE6 from the cell voltages VC1 to VC6 of each of the cell groups CG1 to CG6 when the resistance values of the bus bars BGL1 to BGL7 are the same.

Herein, the operation unit 44 may calculate the corrected cell voltage by subtracting the error voltages VE1 to VE6 from the cell voltages VC1 to VC6 of each of the cell groups CG1 to CG6 when at least one of the bus bars BGL1 to BGL7 has a different resistance value. For example, as illustrated in FIG. 4, when the resistance values of the first and seventh bus bars BGL1' to BGL7' connected to the negative and positive electrode power terminals HVN and HVP are 5Ω and the resistance values of the remaining bus bars BCL2 to BGL6 are 3Ω, the operation unit 44 may calculate the corrected error voltage by reducing the error voltages VE1 and VE6 of the first and sixth cell groups CG1 and CG6 by a ratio of 3/5.

The communication unit 46 transmits the corrected cell voltage for each of the cell groups CG1 to CG6 calculated through the calculation unit 44 to an upper-level controller (not illustrated) or an external display device (not illustrated). Herein, the upper-level controller may be a device for controlling cell balancing or charging and discharging of a battery pack using a correction cell voltage, or a device for controlling a vehicle.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: battery module
20: cell voltage measurement unit
30: voltage drop measurement unit
40: battery management unit

The invention claimed is:

1. A battery management system, comprising:
at least one cell group configured to include first and second battery cells connected in parallel between first and second bus bars;
a plurality of first and second measurement terminals positioned on the first and second bus bars;
a plurality of third and fourth measurement terminals positioned at positions on the first bus bar, which correspond to one of ends of each of the first and second battery cells, respectively;
a cell voltage measuring unit configured to measure a cell voltage of the cell group by using the first and second measurement terminals;
a voltage drop measuring unit configured to measure an error voltage corresponding to a resistance value of the first bus bar by using the third and fourth measurement terminals; and
a battery management unit configured to calculate a corrected cell voltage by using the cell voltage and the error voltage.

2. The battery management system of claim 1, wherein the battery management unit
outputs the corrected cell voltage by subtracting the error voltage from the cell voltage of the cell group.

3. The battery management system of claim 1, wherein the first and second measurement terminals are physically connected to intermediate positions of the first and second bus bars, respectively.

4. The battery management system of claim 1, wherein the third and fourth measurement terminals
are physically connected to positive terminals of the first and second battery cells, respectively.

5. The battery management system of claim 1, wherein the cell voltage measurement unit
measures a voltage difference between the first and second measurement terminals as the cell voltage.

6. The battery management system of claim 1, wherein the voltage drop measurement unit
measures a voltage difference between the third and fourth measurement terminals as the error voltage.

7. The battery management system of claim 1, wherein the cell group includes:
a first cell group configured to include the first and second battery cells connected in parallel between the first and second bus bars; and
a second cell group configured to include third and fourth battery cells connected in parallel between the second bus bar and a third bus bar,
wherein the first and second cell groups are connected in series through the second bus bar.

8. The battery management system of claim 7, wherein the first and second cell groups are connected in series between a first power terminal and a second power terminal, the first bus bar is electrically connected to the first power terminal, and the third bus bar is electrically connected to the second power terminal.

9. The battery management system of claim 8, wherein the first and third bus bars have a different resistance value from the second bus bar.

10. The battery management system of claim 9, wherein the battery management unit
calculates a corrected error voltage by correcting the error voltage corresponding to the first and third bus bars depending on a difference between the resistance value of the first and third bus bars and the resistance value of the second bus bar.

* * * * *